(12) United States Patent
Wang et al.

(10) Patent No.: US 9,601,531 B2
(45) Date of Patent: Mar. 21, 2017

(54) WAFER-LEVEL PACKAGING STRUCTURE FOR IMAGE SENSORS WITH PACKAGING COVER DIKE STRUCTURES CORRESPONDING TO SCRIBE LINE REGIONS

(71) Applicant: China Wafer Level CSP Co., Ltd., Suzhou, Jiangsu (CN)

(72) Inventors: Zhiqi Wang, Suzhou (CN); Qiong Yu, Suzhou (CN); Wei Wang, Suzhou (CN)

(73) Assignee: China Wafer Level CSP Co., Ltd., Suzhou (CN)

( * ) Notice: Subject to any disclaimer, the term of this patent is extended or adjusted under 35 U.S.C. 154(b) by 0 days.

(21) Appl. No.: 14/450,153

(22) Filed: Aug. 1, 2014

(65) Prior Publication Data

US 2015/0054109 A1 Feb. 26, 2015

(30) Foreign Application Priority Data

Aug. 23, 2013 (CN) .......................... 2013 1 0373017

(51) Int. Cl.
*H01L 27/146* (2006.01)
*H01L 31/0232* (2014.01)

(52) U.S. Cl.
CPC .. *H01L 27/14618* (2013.01); *H01L 27/14632* (2013.01); *H01L 27/14685* (2013.01); *H01L 31/0232* (2013.01); *H01L 2224/11* (2013.01)

(58) Field of Classification Search
CPC ..... H01L 31/0203; H01L 31/18; H01L 23/02; H01L 23/498; H01L 23/49811;

(Continued)

(56) References Cited

U.S. PATENT DOCUMENTS 5,795,815 A * 8/1998 Vokoun et al. ............... 438/462
8,916,980 B2 * 12/2014 Dai .................... H01L 27/14618
257/432

(Continued)

FOREIGN PATENT DOCUMENTS

CN 101246895 A 8/2008
CN 101356645 A 1/2009

(Continued)

OTHER PUBLICATIONS

MicroChem: SU-8 photoresist: Internet Archive—Wayback Machine (May 17, 2009) http://web.archive.org/web/20090517213438/http://www.microchem.com/products/su_eight_faq.htm.*

(Continued)

*Primary Examiner* — Marc Armand
*Assistant Examiner* — Younes Boulghassoul
(74) *Attorney, Agent, or Firm* — Wolf, Greenfield & Sacks, P.C.

(57) ABSTRACT

A wafer level packaging structure for image sensors and a wafer level packaging method for image sensors are provided. The wafer level packaging structure includes: a wafer to be packaged including multiple chip regions and scribe line regions between the chip regions; pads and image sensing regions located on a first surface of the wafer and located in the chip regions; first dike structures covering surfaces of the pads and the scribe line regions; a packaging cover arranged facing the first surface of the wafer; and second dike structures located on a surface of the packaging cover. The second dike structures are arranged corresponding to the scribe line regions. The packaging cover and the wafer are jointed fixedly via the second dike structures and the first dike structures.

8 Claims, 5 Drawing Sheets

(58) Field of Classification Search
CPC ........... H01L 23/5386; H01L 27/14618; H01L 27/14632; H01L 27/14685; H01L 27/14687; H01L 24/95; H01L 31/0232; H01L 31/02019
USPC ....... 257/433, 414, 432, 448, 620, 680, 737; 438/49, 64, 65, 68, 106, 125, 458, 613
See application file for complete search history.

(56) References Cited

U.S. PATENT DOCUMENTS

| | | | |
|---|---|---|---|
| 2008/0191334 A1* | 8/2008 | Lee .................. | H01L 27/14618 257/680 |
| 2008/0217715 A1* | 9/2008 | Park .................. | H01L 27/14618 257/434 |
| 2011/0006322 A1* | 1/2011 | Li ........................ | H01L 33/486 257/98 |
| 2011/0233706 A1* | 9/2011 | Hong et al. .................... | 257/433 |
| 2011/0306167 A1 | 12/2011 | Lee et al. | |
| 2012/0049307 A1* | 3/2012 | Huang et al. ................ | 257/432 |
| 2012/0205799 A1* | 8/2012 | Lin ................................ | 257/737 |
| 2012/0313222 A1* | 12/2012 | Lee et al. ...................... | 257/620 |
| 2013/0307147 A1* | 11/2013 | Liu ................................ | 257/737 |
| 2013/0344638 A1* | 12/2013 | Diep et al. ...................... | 438/66 |
| 2014/0264693 A1* | 9/2014 | Oganesian et al. ........... | 257/432 |
| 2014/0367806 A1* | 12/2014 | Tanaka .................. | B81B 3/0097 257/415 |
| 2015/0054108 A1* | 2/2015 | Wang et al. .................. | 257/433 |

FOREIGN PATENT DOCUMENTS

| | | |
|---|---|---|
| CN | 101369591 A | 2/2009 |
| CN | 102386197 A | 3/2012 |

OTHER PUBLICATIONS

Chinese Office Action, dated Jul. 27, 2015, from corresponding Chinese Application No. 201310373017.7.

Chinese Office Action, dated Feb. 1, 2016, from corresponding Chinese Application No. 201310373017.7.

* cited by examiner

WAFER-LEVEL PACKAGING STRUCTURE FOR IMAGE SENSORS WITH PACKAGING COVER DIKE STRUCTURES CORRESPONDING TO SCRIBE LINE REGIONS

The present application claims the priority to Chinese Patent Application No. 201310373017.7, filed with the Chinese Patent Office on Aug. 23, 2013, entitled as "WAFER LEVEL PACKAGING STRUCTURE FOR IMAGE SENSORS AND WAFER LEVEL PACKAGING METHOD FOR IMAGE SENSORS", which is incorporated by reference in its entirety herein.

FIELD

The present disclosure relates to semiconductor packaging technologies, and in particular, to a wafer level packaging structure for image sensors and a wafer level packaging method for image sensors.

BACKGROUND

Due to a decreasing size of an image sensor and an increasing number of pads, the space between the pads gets smaller. Accordingly, higher requirements are set for packaging the image sensor.

Conventionally, the image sensor is generally packaged through a Wire Bonding. With the rapid development of integrated circuits, a size of a product cannot meet expectations due to long wires. Therefore, a Wafer Level Packaging (WLP) gradually takes the place of the Wire Bonding and becomes a common packaging method. In a WLP technology, an entire wafer is packaged, tested, and then cut into individual finished chips. The size of a packaged chip is same as that of a bare chip, which confirms to market requirements for lighter, smaller, shorter, thinner and cheaper microelectronic products.

In the case that image sensors are packaged with a conventional WLP technology, it is usually required to form a packaging cover at photosensitive regions of the image sensors to protect the photosensitive regions from being damaged and contaminated in a packaging process. The transmission of light may be affected even with a transparent packaging cover. The light may not be smoothly received and emitted at the photosensitive regions of the image sensors, thereby affecting overall performances of the chips. Hence, the packaging cover needs to be separated from the wafer at the end of the packaging process. While it is not effectively solved how to easily separate the packaging cover from the wafer without damaging the wafer.

SUMMARY

A wafer level packaging structure for image sensors and a wafer level packaging method for image sensors are provided in the disclosure, with which a packaging cover and a wafer may be easily separated from each other without damaging the wafer.

A wafer level packaging structure for image sensors is provided in the disclosure. The packaging structure includes: a wafer to be packaged including multiple chip regions and scribe line regions between the chip regions, pads and image sensing region located on a first surface of the wafer and located in the chip regions, first dike structures covering surfaces of the pads and the scribe line regions, a packaging cover arranged facing the first surface of the wafer, and second dike structures located on a surface of the packaging cover. The second dike structures are arranged corresponding to the scribe line regions. The packaging cover and the wafer are jointed fixedly via the second dike structures and the first dike structures.

Optionally, bottoms of the second dike structures and tops of the first dike structures adhered to each other through a direct bonding or by a viscose.

Optionally, a width of the second dike structures is smaller than a width of the scribe line regions.

Optionally, the width of the second dike structures is equal to or smaller than a width of incisions generated in cutting the wafer.

Optionally, the width of the second dike structures is larger than 50 um.

Optionally, a width of the first dike structures is larger than the width of the scribe line regions.

Optionally, projections of center lines of the second dike structures onto the first surface of the wafer overlap with center lines of the scribe line regions.

Optionally, the first dike structures completely cover the surfaces of the pads and are spaced.

Optionally, the first dike structures completely cover the surfaces of the pads, the scribe line regions and portions of the chip regions between the pads and the scribe line regions.

Optionally, the first dike structures and the second dike structures are made of photoresist or resin.

Optionally, the second dike structures are integrated with the packaging cover.

Optionally, the packaging cover is made of glass, organic glass or silicon.

A packaging method is further provided by the disclosure, including: providing the forgoing wafer level packaging structure for the image sensors; thinning the wafer from a second surface of the wafer, and etching the second surface of the wafer, until the pads located on the first surface of the wafer are exposed, to form holes penetrating through the wafer; forming an insulating layer on the second surface of the wafer and side walls of the holes, where bottoms of the pads are exposed and are not covered by the insulating layer; forming a bottom wire redistribution layer on the insulating layer and the bottoms of the pads and forming solder balls on the bottom wire redistribution layer; and cutting the wafer along the scribe line regions, where the second dike structures and portions of the packaging cover where the second dike structures are located are removed in cutting the wafer, the wafer is cut into grains, and the packaging cover automatically separates from the grains.

Optionally, a process of providing the wafer level packaging structure for image sensors includes: providing the wafer to be packaged including the multiple chip regions and the scribe line regions between the chip regions, where the pads and the image sensing regions are formed on the first surface of the wafer and in the chip regions, and the first dike structures are formed covering the surfaces of the pads and the scribe line regions; providing the packaging cover, where the second dike structures are formed on the surface of the packaging cover and are arranged corresponding to the scribe line regions; and fixedly jointing tops of the first dike structures and bottoms of the second dike structures, to fixedly joint the packaging cover and the wafer.

Optionally, the first dike structures and the second dike structures are made of photoresist or resin.

Optionally, the packaging cover is made of glass, organic glass or silicon.

Optionally, the second dike structures and the packaging cover are made of a glass, an organic glass or silicon, and an integrated structure of the second dike structures and the packaging cover is formed by performing a micro processing on a whole piece of glass substrate, organic glass substrate or silicon substrate.

Optionally, the wafer is cut by a blade or laser.

Compared with conventional technologies, the disclosure has the following advantages.

The first dike structures and the second dike structures function as supporters between the wafer and the packaging cover. The packaging cover and the wafer are jointed fixedly via the first dike structures and the second dike structures. The second dike structures are arranged corresponding to the scribe line regions. Hence, the second dike structures are removed in the process of cutting the wafer along the scribe line regions, and accordingly, the packaging cover automatically separates from the grains generated by cutting the wafer. Therefore, a mechanical strength between the wafer and the packaging cover and a cavity ratio may be guaranteed in the packaging process, and the packaging cover may automatically separate from the wafer at the end of the packaging process without damaging the wafer.

Furthermore, the width of the second dike structures is equal to or smaller than the width of the incisions formed in cutting the wafer. Hence, it is ensured that the second dike structures arranged corresponding to the scribe line regions are completely removed in the process of cutting the wafer, and accordingly, the packaging cover automatically separates from the grains generated by cutting the wafer.

DETAILED DESCRIPTION OF EMBODIMENTS

As described in the background, in the case that image sensors are packaged with a conventional WLP technology, it is required to separate a packaging cover from a wafer at the end of a packaging process, while it is not effectively solved how to easily separate the packaging cover from the wafer without damaging the wafer.

In view of this, a wafer level packaging structure for image sensors and a wafer level packaging method for image sensors are provided in the disclosure. The wafer level packaging structure for the image sensors includes: a wafer to be packaged including multiple chip regions and scribe line regions between the chip regions; pads and image sensing regions, located on a first surface of the wafer to be packaged and located in the chip regions; first dike structures covering surfaces of the pads and the scribe line regions; a packaging cover arranged facing the first surface of the wafer; and second dike structures located on a surface of the packaging cover. The second dike structures are arranged corresponding to the scribe line regions. The packaging cover and the wafer are jointed fixedly via the second dike structures and the first dike structures. Tops of the first dike structures contact with the packaging cover. In the wafer level packaging structure, the first dike structures and the second dike structures function as supporters between the wafer and the packaging cover, and the packaging cover and the wafer are fixedly jointed via only the first dike structures and the second dike structures. Since the second dike structures are arranged corresponding to the scribe line regions, the second dike structures are removed in a process of cutting the wafer along the scribe line regions. Accordingly, the packaging cover automatically separates from grains generated by cutting the wafer. Hence, a mechanical strength between the wafer and the packaging cover and a cavity ratio may be guaranteed in the packaging process, and the packaging cover and the wafer may automatically separate from each other at the end of the packaging process without damaging the wafer.

To clarify the foregoing objectives, features and advantages of the disclosure, embodiments of the disclosure are detailed hereinafter in conjunction with drawings.

A packaging method is provided according to an embodiment of the disclosure. FIGS. 1 to 10 are schematic diagrams of a packaging structure for image sensing chips according to an embodiment of the disclosure, in a packaging process.

Figure 1:
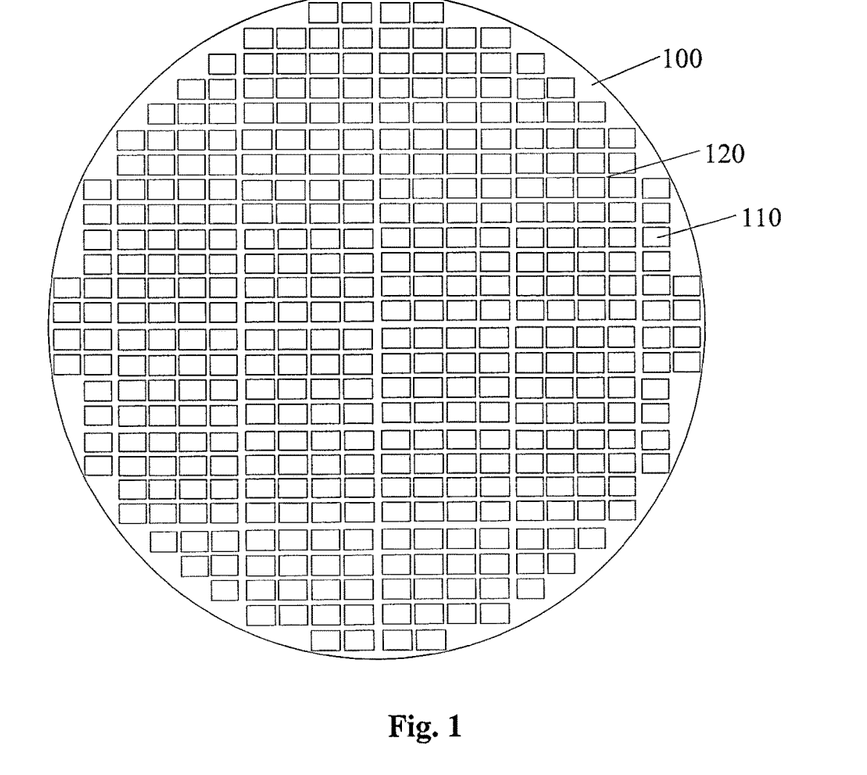
FIGS. 1 to 10 are schematic diagrams of a packaging structure for image sensing chips according to an embodiment of the disclosure, in a packaging process.
Figure 2:
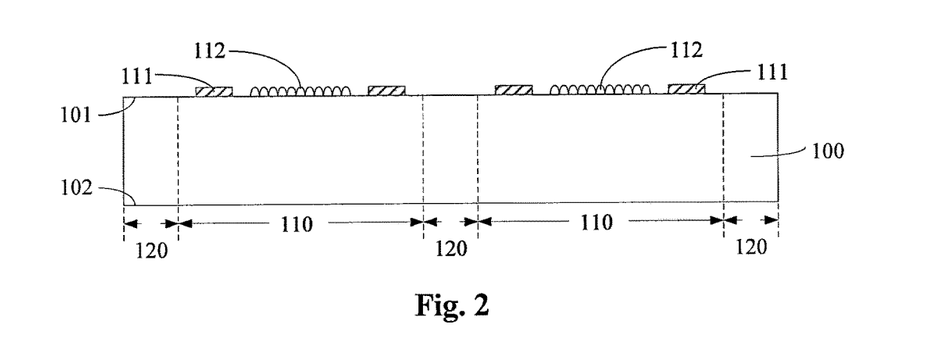

FIG. 1 is a top view of a wafer to be packaged, and FIG. 2 is a sectional view of a part of the water to be packaged. As shown in FIG. 1 and FIG. 2, a water 100 to be packaged is provided. The wafer 100 to be packaged includes multiple chip regions 110 and scribe line regions 120 between the chip regions 110. On a first surface 101 of the wafer 100 to be packaged, pads 111 and image sensing regions 112 are arranged in the chip regions 110.

The wafer 100 to be packaged includes the multiple chip regions 110 arranged in a matrix and the scribe line regions 120 between the chip regions 110. In a subsequent process, the wafer 100 is cut along the scribe line regions 120 into independent grains. One image sensing chip is correspondingly generated with each grain.

The wafer 100 to be packaged includes the first surface 101 and a second surface 102. On the first surface 101 of the wafer 100 to be packaged, the pads 111, the image sensing regions 112, and metal connection structures (not shown in FIG. 1 or 2) electrically connecting the pads 111 and the image sensing regions 112 are arranged in the chip regions 110. An image sensing unit and a circuit connected to the image sensing unit are provided in each image sensing region 112. External light is received and converted into an electrical signal, by the image sensing unit. The electrical signal is transmitted to other circuits via the pads, a subsequently formed bottom wire redistribution layer and subsequently formed solder balls.

According to the embodiment, in each chip region 110, the image sensing region 112 is located in the center of the chip region 110 and the pads 111 are located at a periphery of the chip region 110, to facilitate wiring. Holes penetrating through the wafer 100 are subsequently formed at positions corresponding to the pads 111. The pads 111 located on the first surface are electrically connected, via the holes, to the solder balls subsequently formed on the second surface.

According to other embodiments, locations of the pads and the image sensing region may be flexibly adjusted based on requirements for wiring.

Figure 11:
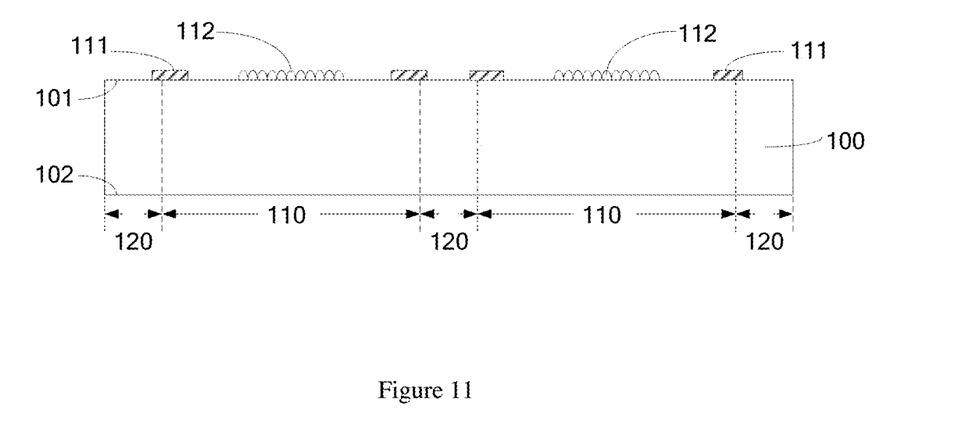
FIG. 11 is a sectional view of a part of the wafer to be packaged according to another embodiment of the disclosure.

According to the embodiment, the pads 111 in one chip region 110 are independent from the pads 111 in other chip regions 110. According to other embodiments, the pads in one chip region are connected with the pads in adjacent chip regions, i.e., the pads are arranged over the scribe line regions, as shown in FIG. 11. Since the scribe line regions are cut off after packaging, the pads arranged over the scribe line regions are cut off, and accordingly, an electrical performance of any image sensing chip may not be affected.

Figure 3:
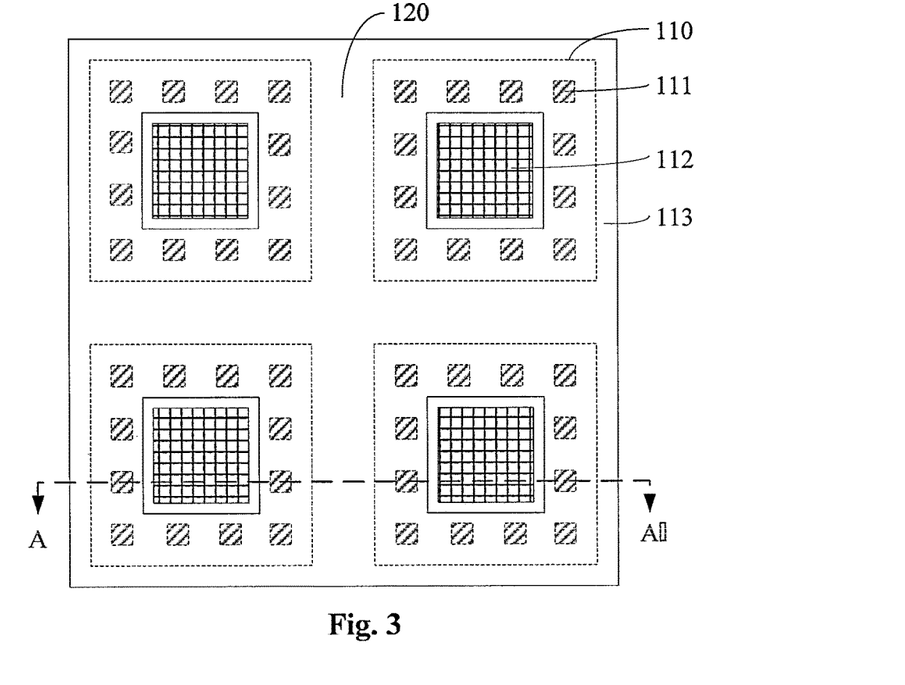
Figure 4:
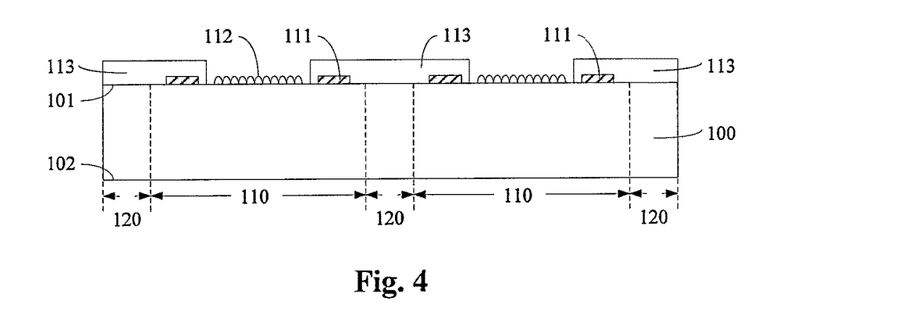

FIG. 3 is a top view of a part of a wafer to be packaged. FIG. 4 is a sectional view of the part of the wafer to be packaged shown in FIG. 3. As shown in FIGS. 3 and 4, a first dike structure 113 is provided covering surfaces of the pads 111.

According to the embodiment, the first dike structures 113 are made of a photoresist. The first dike structures 113 are manufactured through a wet film lamination process or a dry film lamination process. Manufacturing the first dike structures 113 through the wet film lamination process includes: forming a photoresist film on the first surface 101 through a spin-on PR coating process, pre-baking the photoresist film, performing an exposure and a development on the photoresist film, and forming a photoresist pattern covering the surfaces of the pads 111 and the scribe line regions 120, where the photoresist pattern serves as the first dike structures 113. Manufacturing the first dike structures 113 through the dry film lamination process includes: sticking a dry photoresist film on the first surface 101, performing an exposure and a development on the dry photoresist film, and forming a photoresist pattern covering the surfaces of the pads 111 and the scribe line regions 120, where the photoresist pattern serves as the first dike structures 113.

According to other embodiments, the first dike structures may be made of other organic polymer materials, for example, resins such as epoxy resin, benzocyclobutene, polyimide, acrylic resin. The first dike structures may be manufactured through a resin printing process, etc.

According to the embodiment, the first dike structures 113 completely cover the surfaces of the pads 111, the scribe line regions 120, and portions of the chip regions 110 between the pads 111 and the scribe line regions 120. The image sensing regions 112 are exposed and are not covered by the first dike structures 113. The first dike structures 113 surround the image sensing regions 112. Subsequently, the wafer 100 and a packaging cover are jointed, and cavities are formed accommodating the image sensing regions 112. Hence, the image sensing regions 112 may not be damaged in the packaging process. As the packaging cover, the first dike structures 113 and second dike structures may be subsequently used to support the wafer 100, a mechanical strength between the packaging cover and the wafer may be weaken if a cavity ratio, i.e., a ratio of an area of a projection of one cavity onto the first surface of the wafer to an area of one whole chip region, is too large. Accordingly, the wafer may easily be damaged at the image sensing regions in subsequent processes of grinding, etching, etc. Therefore, the cavity ratio may be controlled by adjusting widths and positions of the first dike structures 113, to protect the wafer from being damaged.

In a subsequent process, the holes penetrating through the wafer 100 are formed at the positions corresponding to the pads 111 through etching. A layer to be etched may be exerted with a stress during etching, and accordingly, it is required to form the first dike structures 113 covering whole surfaces of the pads 111, to support the pads 111 during etching. The first dike structures 113 are provided with a photoresist pattern and have a high mechanical strength, and the pads are supported by the first dike structures 113 and the second dike structures. Hence, the pads 111 may not be penetrated or may not separate from the wafer, in a subsequent process of etching the second surface 102 of the wafer 100 to expose bottoms of the pads 111. Accordingly, a quality of the wafer level packaging structure is ensured.

According to other embodiments, the first dike structures may include two parts respectively covering the surfaces of the pads and the scribe line regions. The subsequently formed second dike structures are fixedly jointed with the part of the first dike structures covering the scribe line regions. A width of the second dike structures arranged corresponding to the scribe line regions is larger than a width of the scribe line regions.

According to other embodiments, the pads 111 are spaced at the peripheries of the chip regions 100 to form loops. First dike structures covering the surfaces of the pads may also be spaced to form loops. Each first dike structure covers surface(s) of one or multiple pads.

Figure 5:
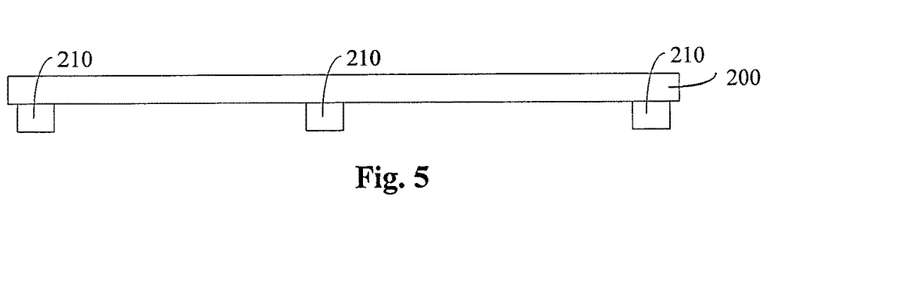

As shown in FIG. 5, the packaging cover 200 is provided. The second dike structures 210 are formed on a surface of the packaging cover 200. The second dike structures 210 are arranged corresponding to the scribe line regions 120 (shown in FIG. 4).

The packaging cover 200 may be made of transparent materials or opaque materials, such as glass, organic glass or silicon, where the glass may be a common glass mingled with impurities or a quartz glass without impurities. The packaging cover 200 and the first dike structures 113 (shown in FIG. 4) arranged on the wafer 100 form the cavities accommodating the image sensing regions 112, to prevent the image sensing units in the image sensing regions 112 from being damaged or contaminated in subsequent processes such as thinning, etching, and depositing the wafer 100. The second dike structures 210 are arranged corresponding to the scribe line regions 120 of the wafer 100.

The second dike structures 210 are arranged corresponding to the scribe line regions 120, the second dike structures 210 should be removed in a process of cutting the wafer along the scribe line regions, and accordingly, the packaging cover may automatically separate from the wafer. Therefore, a width of the second dike structures 210 is smaller than that of the scribe line regions 120. According to a preferred embodiment, the width of the second dike structures 210 may be smaller than that of incisions formed by cutting the wafer 100. Hence, the second dike structures 210 adhered to the wafer 100 through a viscose may be removed in the process of cutting the wafer, and accordingly, the packaging cover may automatically separate from the wafer. According to the embodiment, the width of the second dike structures 210 is larger than 50 um.

According to the embodiment, the second dike structures 210 are made of the photoresist. The second dike structures 210 are manufactured through the wet film lamination process or the dry film lamination process, which may be referred to the process for manufacturing the first dike structures 113. No detail is further given here.

According to other embodiments, the second dike structures may be made of other organic polymer materials, for example, resins such as epoxy resin, benzocyclobutene resin, polyimide resin or acrylic resin. The second dike structures may be manufactured through a resin printing process, etc.

According to other embodiments, the second dike structures and the packaging cover may be made of a same material such as glass, organic glass or silicon. An integrated structure of the second dike structures and the packaging cover is formed by performing a micro processing on a whole piece of glass substrate, organic glass substrate or silicon substrate.

Figure 6:
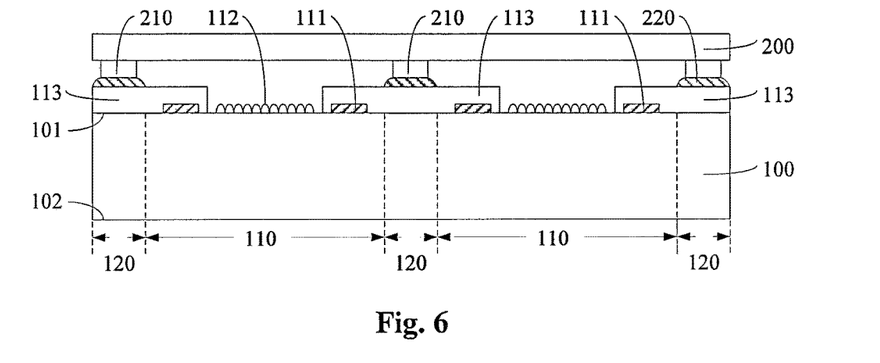

As shown in FIG. 6, the viscose 220 is applied to the bottoms of the second dike structures 210. Tops of the first dike structures 113 and the bottoms of the second dike structures 210 are adhered to each other by the viscose 220, and accordingly, the packaging cover 200 and the wafer 100 are fixedly jointed.

The bottoms of the second dike structures 210 and the tops of the first dike structures 113 are adhered to each other by the viscose 220, the second dike structures 210 are arranged corresponding to the scribe line regions 120, and the width of the second dike structures 210 is smaller than the width of the scribe line regions 120. According to a preferred embodiment, the width of the second dike structures 210 is smaller than the width of the incisions formed by cutting the wafer 100. Hence, the second dike structures 210 adhered to the first dike structures 113 through the viscose are removed in the process of cutting the wafer along the scribe line regions, and accordingly, the packaging cover 200 may automatically separate from the wafer. The mechanical strength between the wafer and the packaging cover and the cavity ratio may be guaranteed during the packaging process, and the packaging cover 200 may automatically separate from the wafer 100 at the end of the packaging process without damaging the wafer 100.

According to other embodiments, in the case that the first dike structures are manufactured through the dry film lamination process and the second dike structures are manufactured through the dry film lamination process, the bottoms of the second dike structures and the tops of the first dike structures may be fixedly jointed through a direct bounding because the photoresist processed with the dry film lamination process has a viscosity.

According to the embodiment, after the tops of the first dike structures 113 are bonded to the bottoms of the second dike structures 210, projections of center lines of the second dike structures 210 onto the first surface 101 overlap with center lines of the scribe line regions 120 of the wafer 100. Accordingly, the second dike structures 210 may be completely removed in the process of cutting the wafer. According to other embodiments, the projections of the center lines of the second dike structures onto the first surface 101 and the center lines of the scribe line regions of the wafer may not overlap with each other but are spaced with a distance, and projections of the second dike structures onto the first surface should be completely included in the scribe line regions of the wafer.

Figure 7:
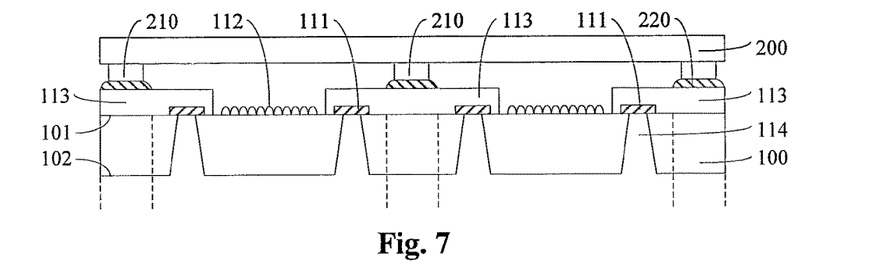

As shown in FIG. 7, the wafer 100 is thinned from a side of the second surface 102, and the second surface 102 of the wafer 100 is etched, until the pads 111 on the first surface 101 of the wafer 100 are exposed, to form holes 114 penetrating through the wafer 100.

The wafer 100 may be thinned through a mechanical lapping, a chemical mechanical polishing, etc. An appropriate process for thinning the wafer may be adopted by those skilled in the art based on actual needs, which is not detailed here.

According to the embodiment, the wafer 100 is merely etched where correspond to the pads 111, to form the holes 114. According to other embodiments, the wafer 100 is also etched where correspond to the scribe line regions to reduce the thicknesses there. Hence, it is advantageous to improve an efficiency in cutting the wafer, and the wafer may not be damaged during the process of cutting.

Figure 8:
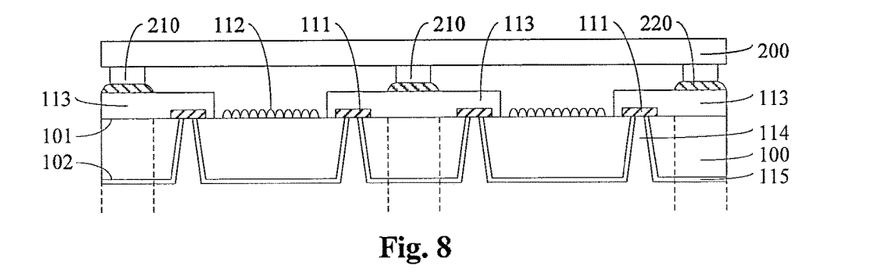

As shown in FIG. 8, an insulating layer 115 is formed on side walls of the holes 114 and the second surface 102 of the wafer 100, while bottoms of the pads 111 are exposed and are not covered by the insulating layer 115.

The insulating layer 115 insulates electricity from the second surface of the wafer 100, and serves as a protection layer for the second surface of the wafer 100. The insulating layer 115 may be made of insulating materials such as insulating resin, monox, silicon nitride. According to the embodiment, the insulating layer 115 is made of epoxy resin.

A process of forming the insulating layer 115 includes: forming an insulating film (not shown in FIG. 8) on the second surface 102 of the wafer 100, the side walls of the holes 114 and exposed bottoms of the pads 111; forming a patterned photoresist film (not shown in FIG. 8) on the insulating film, while portions of the insulating film where cover the bottoms of the pads 111 are exposed and are not covered by the patterned photoresist film; and etching the exposed portions of the insulating film until the pads 111 are exposed. Accordingly, the insulating layer 115 is formed with the remained insulating film.

Figure 9:
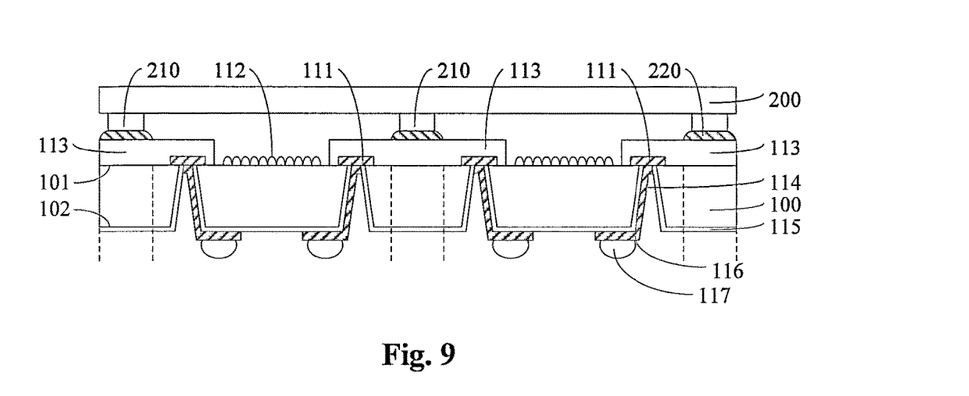

As shown in FIG. 9, a bottom wire redistribution layer 116 is formed on the insulating layer 115 and the bottoms of the pads 111. Solder balls 117 are formed on the bottom wire redistribution layer 116.

According to the embodiment, a process of forming the bottom wire redistribution layer 116 includes: forming a metal film (not shown in FIG. 9) on the insulating layer 115; and etching the metal film to form the bottom wire redistribution layer 116. The bottom wire redistribution layer 116 may be made of metallic materials such as copper, aluminum, aluminum copper alloy.

According to the embodiment, the solder balls 117 are formed on the bottom wire redistribution layer 116. The solder balls 117 are made of soldering tin. According to other embodiments, an infiltration layer is formed on the bottom wire redistribution layer. The infiltration layer includes at least one of elements of gold, silver, indium and tin. Since the soldering tin has a good performance of infiltration on the infiltration layer including the element of gold, silver, indium or tin, the solder balls and the bottom wire redistribution layer 116 are solidly jointed, and the solder balls may not easily separate from the bottom wire redistribution layer 116.

Figure 10:
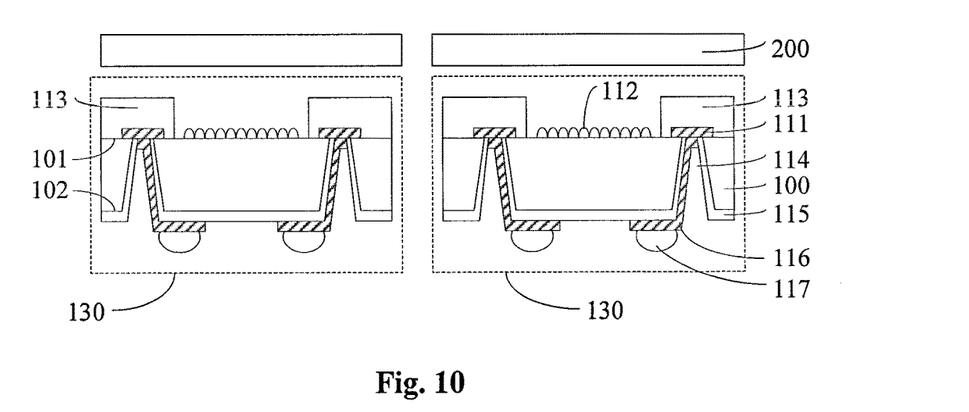

As shown in FIG. 10, the wafer 100 may be cut, along the scribe line regions 120, into grains 130. The second dike structures 210 and portions of the packaging cover 200 where the second dike structures 210 are located are removed in the process of cutting the wafer 100. Hence, the packaging cover 200 may separate from the grains 130.

The wafer 100 may be cut by a blade or laser. According to the embodiment, the wafer 100 is cut with the laser for narrow incisions. In cutting the wafer 100 along the center lines of the scribe line regions by either the blade or the laser, the incisions have a certain width. Accordingly, the second dike structures 210 arranged corresponding to the scribe line regions 120 and the portions of the packaging cover 200 where the second dike structures 210 are located are removed. The packaging cover 200 and the wafer 100 are jointed fixedly via only the first dike structures 113 and the second dike structures 210. Hence, in the case that the second dike structures 210 are removed and the wafer 100 is cut into the grains 130, the packaging cover 200 automatically separates from the grains 130. One image sensing chip is correspondingly generated with each grain.

According to the embodiment, the packaging cover 200 and the wafer 100 are jointed fixedly via only the first dike structures 113 and the second dike structures 210, and the second dike structures 210 are arranged corresponding to the scribe line regions 120. Hence, in the case that the second dike structures 210 are removed in the process of cutting the wafer, the packaging cover 200 automatically separates from the grains 130. A process of removing the viscose 220 through, for example, a wet etching, which may result in damaging the wafer, is not required.

A wafer level packaging structure for image sensors is further provided according to an embodiment of the disclosure. As shown in FIG. 6, the packaging structure includes: a wafer 100 to be packaged including multiple chip regions 100 and scribe line regions 120 between the chip regions 110; pads 111 and image sensing regions 112 located on a first surface 101 of the wafer 100 and located in the chip regions 110; first dike structures 113 covering surfaces of the pads 111 and the scribe line regions 120; a packaging cover 200 arranged facing the first surface 101 of the wafer 100; and second dike structures 210 located on a surface of the packaging cover 200. Inc second dike structures 210 are arranged corresponding to the scribe line regions 120. The packaging cover 200 and the wafer 100 are adhered to each other by a viscose 220 provided between bottoms of the second dike structures 210 and tops of the first dike structures 113.

According to the embodiment, the bottoms of the second dike structures 210 and the tops of the first dike structures 113 are adhered to each other by the viscose 220. Accordingly, the packaging cover 200 and the wafer 100 are fixedly jointed.

According to other embodiments, the bottoms of the second dike structures and the tops of the first dike structures are directly bonded, to fixedly joint the packaging cover and the wafer.

A width of the second dike structures 210 is smaller than that of the scribe line regions 120. According to a preferred embodiment, the second dike structures 210 has the width smaller than or equal to that of incisions generated during a process of cutting the wafer. According to the embodiment, the width of the second dike structures is larger than 50 um.

According to the embodiment, the first dike structures 113 completely cover the surfaces of the pads 111, the scribe line regions 120 and portions of the chip regions 110 between the pads 111 and the scribe line regions 120.

According to other embodiments, the first dike structures may include two parts respectively covering the surfaces of the pads and the scribe line regions. The subsequently formed second dike structures are fixedly jointed with the part of the first dike structures covering the scribe line regions. A width of the second dike structures arranged corresponding to the scribe line regions is larger than a width of the scribe line regions.

According to other embodiments, the pads 111 are spaced at the peripheries of the chip regions 100 to form loops. First dike structures covering the surfaces of the pads may also be spaced to form loops. Each first dike structure covers surface(s) of one or multiple pads.

According to the embodiment, the first dike structures 113 and the second dike structures 210 are made of photoresist. According to other embodiments, the second dike structures may be made of other organic polymer materials, for example, resins such as epoxy resin, benzocyclobutene resin, polyimide resin or acrylic resin; or an integrated structure of the second dike structures and the packaging cover, made of glass, organic glass or silicon, is formed by performing a micro processing on a whole piece of glass substrate, organic glass substrate or silicon substrate.

The disclosure is not restricted to the above embodiments. Various improvements and modifications may be made by those skilled in the art without departing from the principle and scope of the disclosure. Hence, the protection scope of the disclosure should be in accordance with what is defined in the claims.

The invention claimed is:

1. A wafer level packaging structure for image sensors, comprising:
   a wafer to be packaged comprising a plurality of chip regions and scribe line regions between the chip regions,
   image sensing regions located on a first surface of the wafer and located in the chip regions,
   pads located on the first surface of the wafer and crossing over the scribe line regions;
   first dike structures covering surfaces of the pads and the scribe line regions,
   a packaging cover arranged facing the first surface of the wafer, and
   second dike structures located on a surface of the packaging cover;
   wherein the pads are spaced at peripheries of the chip regions, each first dike structure covers surface of one or more of the pads, and the first dike structures covering the surfaces of the pads are spaced from each other;
   wherein the second dike structures are arranged corresponding to the scribe line regions, and the packaging cover and the wafer are joined fixedly via the second dike structures and the first dike structures,
   wherein both the second dike structure and the packaging cover are made of silicon and the second dike structures are integrated with the packaging cover;
   wherein a width of the second dike structures is smaller than a width of the scribe line regions, and
   wherein the width of the second dike structures is equal to or smaller than a width of incisions generated in singulating the wafer.

2. The wafer level packaging structure for the image sensors according to claim 1, wherein bottoms of the second dike structures and tops of the first dike structures are adhered to each other through a direct bonding or by a viscose.

3. The wafer level packaging structure for the image sensors according to claim 1, wherein the width of the second dike structures is larger than 50 um.

4. The wafer level packaging structure for the image sensors according to claim 1, wherein a width of the first dike structures is larger than a width of the scribe line regions.

5. The wafer level packaging structure for the image sensors according to claim 1, wherein projections of center lines of the second dike structures onto the first surface of the wafer overlap with center lines of the scribe line regions.

6. The wafer level packaging structure for the image sensors according to claim 1, wherein the first dike structures completely cover the surfaces of the pads and are spaced.

7. The wafer level packaging structure for the image sensors according to claim 1, wherein the first dike structures completely cover the surfaces of the pads and the scribe line regions.

8. The wafer level packaging structure for the image sensors according to claim 1, wherein the first dike structures each cover one pad.

* * * * *